US012768867B2

(12) United States Patent
Tirumala

(10) Patent No.: US 12,768,867 B2

(45) Date of Patent: Oct. 20, 2026

(54) OVER CURRENT PROTECTION CIRCUIT ARRANGED FOR PROVIDING AN OVER CURRENT SIGNAL, AS WELL AS A CORRESPONDING METHOD AND COMPUTER PROGRAM PRODUCT

(71) Applicant: NEXPERIA B.V., Nijmegen (NL)

(72) Inventor: Rohit Tirumala, Sunnyvale, CA (US)

(73) Assignee: Nexperia B.V>, Nijmegen (NL)

( * ) Notice: Subject to any disclaimer, the term of this patent is extended or adjusted under 35 U.S.C. 154(b) by 117 days.

(21) Appl. No.: 18/735,737

(22) Filed: Jun. 6, 2024

(65) Prior Publication Data

US 2024/0410921 A1 Dec. 12, 2024

Related U.S. Application Data

(60) Provisional application No. 63/506,909, filed on Jun. 8, 2023.

(51) Int. Cl.

| | |
|---|---|
| ***G01R 15/16*** | (2006.01) |
| ***G01R 19/165*** | (2006.01) |
| ***H02H 1/00*** | (2006.01) |
| ***H02H 3/08*** | (2006.01) |

(52) U.S. Cl.

CPC ....... *G01R 19/16504* (2013.01); *G01R 15/16* (2013.01); *H02H 1/0007* (2013.01); *H02H 3/08* (2013.01)

(58) Field of Classification Search

CPC .............. G01R 19/16504; G01R 15/16; H02H 1/0007; H02H 3/08

USPC .............................. 324/500, 600, 76.11, 679

See application file for complete search history.

(56) References Cited

U.S. PATENT DOCUMENTS

| | | | | |
|---|---|---|---|---|
| 7,558,037 | B1 * | 7/2009 | Gong | H02M 1/32 361/111 |
| 10,978,891 | B2 * | 4/2021 | Snyder | H02J 7/62 |
| 2010/0026268 | A1 * | 2/2010 | Chang | H02M 3/33507 323/288 |
| 2010/0328831 | A1 * | 12/2010 | Zhang | H02M 1/32 361/93.1 |
| 2013/0070379 | A1 * | 3/2013 | Pan | H02H 3/093 361/87 |
| 2016/0181929 | A1 * | 6/2016 | Chen | H02M 1/08 363/21.18 |
| 2020/0195004 | A1 * | 6/2020 | Xiong | G01R 33/07 |
| 2024/0079867 | A1 * | 3/2024 | Rigoni | H02H 3/093 |

* cited by examiner

*Primary Examiner* — Giovanni Astacio-Oquendo

*Assistant Examiner* — Trung Q Nguyen

(74) *Attorney, Agent, or Firm* — Ruggiero McAllister & McMahon LLC

(57) ABSTRACT

An over current protection circuit arranged for providing an over current signal, the over current protection circuit includes a compare stage arranged for determining that a blanking time value is higher than a predefined reference value, an output stage arranged for outputting the over current signal based on the determination, a blanking time stage arranged for generating the blanking time value, and the blanking time stage is arranged to start generating the blanking time value upon a load current exceeding a predefined set current, the blanking time stage is further arranged to modulate the blanking time value based on a magnitude in which the load current exceeds the predefined set current.

18 Claims, 3 Drawing Sheets

OVER CURRENT PROTECTION CIRCUIT ARRANGED FOR PROVIDING AN OVER CURRENT SIGNAL, AS WELL AS A CORRESPONDING METHOD AND COMPUTER PROGRAM PRODUCT

CROSS-REFERENCE TO RELATED APPLICATIONS

This application claims the benefit under 35 U.S.C. § 119(e) of U.S. Provisional Patent Application No. 63/506,909 filed Jun. 8, 2023, the contents of which are incorporated by reference herein in its entirety.

BACKGROUND

1. Field of the Disclosure

The present disclosure generally relates to the field of over current protection and, more specifically, to over current protection circuits that are better designed to cope with current loads that tend to have high peak to average ratios.

2. Description of the Related Art

Overcurrent protection is a mechanism used in electrical and electronic systems to prevent damage to components or devices from excessive current flowing through them. Overcurrent can occur due to various reasons, such as a short circuit, a fault in the system, or an overload condition.

There are several methods to provide overcurrent protection, including fuses, circuit breakers, and current-limiting devices. These methods are designed to interrupt or limit the flow of current when it exceeds a certain threshold to prevent damage to the system.

Fuses are one of the most common types of overcurrent protection devices. They are simple devices that consist of a wire or filament that melts when the current exceeds a certain threshold. The melted wire or filament breaks the circuit, interrupting the flow of current and protecting the system. Fuses come in various sizes and ratings, and they need to be replaced after they have melted.

Current-limiting devices are another type of overcurrent protection mechanism. They work by limiting the amount of current that can flow through the system, even in the event of an overcurrent condition. This type of protection is commonly used in power supplies and electronic circuits to prevent damage to components and devices. Examples of current-limiting devices include current-limiting resistors, transistors, and integrated circuits.

E-fuses, i.e. electronic fuses, are a type of overcurrent protection device that uses solid-state technology to provide protection against overcurrent conditions. E-fuses are typically used in electronic circuits, where they provide reliable and precise overcurrent protection.

E-fuses work by monitoring the current flowing through the circuit and responding to overcurrent conditions by limiting the current or disconnecting the circuit altogether. Unlike traditional fuses, e-fuses do not rely on a physical element to break the circuit, but instead use semiconductor devices, such as MOSFETs, to provide the protection.

One advantage of e-fuses over traditional fuses is that they can be reset automatically, without the need for replacement. This can save time and money, especially in applications where the fuse may be subject to frequent overcurrent conditions.

Overcurrent protection may be important in ensuring the safe and reliable operation of electrical and electronic systems. It can prevent damage to components and devices, as well as prevent fires and other hazards. Designers and engineers may need to carefully consider the overcurrent protection requirements of their systems and choose the appropriate protection mechanism based on the application and the specific requirements.

SUMMARY

The inventors have found that it might be beneficial to provide for an over current protection circuit that is better able to cope with current loads that tend to have high peak to average ratios.

In a first aspect of the present disclosure, there is provided an over current protection circuit arranged for providing an over current signal, said over current protection circuit comprising:

- a compare stage arranged for determining that a blanking time value is higher than a predefined reference value;
- an output stage arranged for outputting said over current signal based on said determination,
- a blanking time stage arranged for generating said blanking time value, wherein said blanking time stage is arranged to start generating said blanking time value upon a load current exceeding a predefined set current; wherein said blanking time stage is further arranged to modulate the blanking time value based on a magnitude in which said load current exceeds said predefined set current.

The inventors have realized that load switches and eFuses typically include an over current protection that turns off the corresponding power switch, or limit the corresponding current, when the load current exceeds a predefined current limit.

In some applications, for example audio amplifiers and motor drives, the load currents tend to have a relatively high peak to average ratios, i.e. they have high peak currents that last for short period of time. Typically, there are two ways to deal with this:

One option is to set the trip current, i.e. the predefined set current at which the over current signal is to be outputted, higher than the peak current. This, however, means an output short that causes a current larger than the average load current, but lower than the peak current will go undetected and might result in damage to the system.

Another option is to set the trip current to be more than the average current, but less than the peak current. This will prevent damage to the system but cause the load switch or eFuse to false trip.

Manufacturers of eFuse and load switches have tried to overcome this issue by adding an over current blanking timer. This blanking timer starts when the load current exceeds the set current limit. The switch does not turn off till the blanking timer times out. The user can program the blanking timer based on the requirements of the system.

The inventors have realized that the issue with the over current blanking timer is that the time is fixed and is independent of the magnitude of the over current. It treats a 10% over current condition the same as a 50% over current condition, for example. This might cause damage to the system if the timer is not designed properly.

As such, the present disclosure is directed to no longer providing a fixed blanking time, i.e. fixed blanking time value, but modulates the blanking time based on the magnitude of the over current.

It the over current is high, for example 50% over current condition, then the over current signal will be generated with a relatively short delay. If the over current is low, for example 10% over current condition, then the over current signal will be generated with a relatively long delay.

In an example, the blanking time stage is arranged to modulate the blanking time value such that the blanking time value is inversely proportional to said magnitude in which said load current exceeds said predefined set current.

This will allow small over current conditions to persist for long periods of time, whereas large over current conditions can persist for only small periods of time.

In a further example, the blanking time stage is arranged to module the blanking time value such that the blanking time value is proportional to the square of the magnitude in which said load current exceeds said predefined set current.

This makes the over current protection circuit to mimic the behaviour of a traditional fuse which has an $I^2t$ behaviour. As such, the over current protection circuit will more closely relate, from a functional perspective, to a traditional fuse.

In a further example, the blanking time stage comprises:

a timer capacitor arranged for storing energy;

a first current source arranged for charging said timer capacitor, wherein a current provided by said first current source is proportional to said predefined set current;

a second current source arranged for discharging said timer capacitor, wherein a current provided by said second current source is proportional to said load current;

wherein an output of said timer capacitor is connected to said compare stage.

This particular example describes an implementation of the over current protection circuit. The working principle of the implementation is discussed here below.

The basic functioning of the system is related to the charging and discharging of the timer capacitor. If the load current is relatively high, then the timer capacitor is discharged quickly. If the load current is relatively low, then the timer capacitor is discharged slowly. As such, the timer value for when the overcurrent signal is to be generated is modulated based on the amplitude of the load current.

There may be two aspects to consider in this particular example. The predefined set current, i.e. the trip current, is used to charge the capacitor. The load current is used to discharge the capacitor. If the predefined set current is higher than the load current, then the capacitor will charge up to its maximum value. No overload condition will then occur.

However, if the load current is higher than the trip current, then the capacitor will (slowly) discharge. The voltage over the capacitor will (slowly) reduce. The compare stage of the present disclosure may compare the voltage over the capacitor with a predefined reference voltage. If the voltage over the capacitor falls below the predefined reference voltage, then the compare stage may issue an overload condition.

In a further example, the blanking time stage further comprises:

a third current source for discharging said timer capacitor, wherein a current provided by said third current source is constant.

The third current source may be used additionally to provide some sort of reference current.

In another example, the compare stage comprises:

a first comparator, wherein an inverting input of said first comparator is connected to the output of the timer capacitor, and wherein a non-inverting input of said first comparator is connected to said predefined reference value.

The comparator may, for example, be embodied as an operational amplifier, OPAMP. The OPAMP compare the two input signals. If the signal provided to the non-inverting input is higher than the signal provided to the inverting input, then a high output signal is provided. If the signal provided to the non-inverting input is lower than the signal provided to the inverting input, then a low output signal is provided.

In a further example, the compare stage further comprises:

a second comparator, wherein an inverting input of said second comparator is arranged to receive said predefined set current, and wherein a non-inverting input of said second comparator is connected to said load current, wherein said output stage comprises:

an AND port arranged for receiving an output of said first comparator and an output of said second comparator, wherein an output of said AND port is said over current signal.

In yet another example, the blanking time stage further comprises:

a switch connected in series with said third current source for activating, and deactivating, said third current source, wherein said switch is controlled by said output of said second comparator.

In a second aspect of the present disclosure, there is provided a method for providing an over current signal using an over current protection circuit in accordance with any of the previous examples, wherein said method comprises the steps of:

determining, by said compare stage, that a blanking time value is higher than a predefined reference value;

outputting, by said output stage, said over current signal based on said determination, generating, by said blanking time stage, said blanking time value, wherein said blanking time value is started to be generated upon a load current exceeding a predefined set current;

wherein said step of generating comprises modulating said blanking time value based on a magnitude in which said load current exceeds said predefined set current.

It is noted that the advantages as explained with respect to the first aspect of the present disclosure, being the over current protection circuit, are also applicable to the second aspect of the present disclosure, being the method of operating such an over current protection circuit.

In an example, the step of modulating further comprises:

modulating the blanking time value such that the blanking time value is inversely proportional to said magnitude in which said load current exceeds said predefined set current.

In a further example, the step of modulating further comprises:

modulating the blanking time value such that the blanking time value is proportional to the square of the magnitude in which said load current exceeds said predefined set current.

In yet another example, the blanking time stage comprises:

a timer capacitor arranged for storing energy;

a first current source arranged for charging said timer capacitor, wherein a current provided by said first current source is proportional to said predefined set current;

a second current source arranged for discharging said timer capacitor, wherein a current provided by said second current source is proportional to said load current;

wherein an output of said timer capacitor is connected to said compare stage.

In a further example, the blanking time stage further comprises:

a third current source for discharging said timer capacitor, wherein a current provided by said third current source is constant.

In a detailed example, the compare stage comprises:

a first comparator, wherein an inverting input of said first comparator is connected to the output of the timer capacitor, and wherein a non-inverting input of said first comparator is connected to said predefined reference value, a second comparator, wherein an inverting input of said second comparator is arranged to receive said predefined set current, and wherein a non-inverting input of said second comparator is connected to said load current, a switch connected in series with said third current source for activating, and deactivating, said third current source, wherein said switch is controlled by said output of said second comparator, wherein said output stage comprises:

an AND port arranged for receiving an output of said first comparator and an output of said second comparator, wherein an output of said AND port is said over current signal.

In a third aspect of the present disclosure, there is provided a computer program product comprising a computer readable medium having instructions stored thereon which, when executed by a controller, cause said controller to implement a method in accordance with any of the examples as provided above.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

Figure 1:
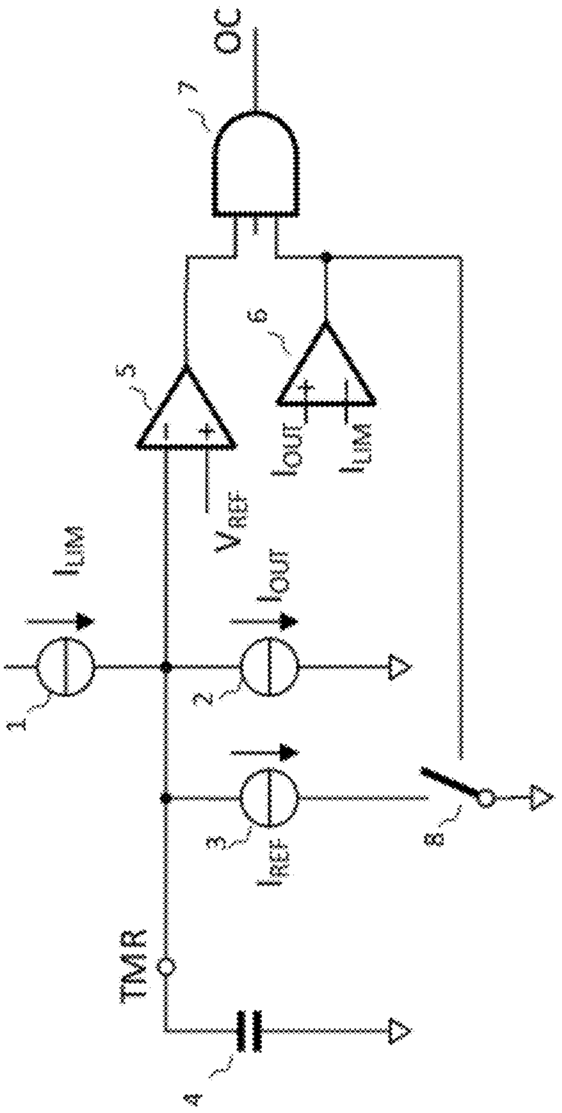
FIG. 1 discloses an example of an over current protection circuit in accordance with the present disclosure.

It is noted that in the description of the figures, same reference numerals refer to the same or similar components performing a same or essentially similar function.

A more detailed description is made with reference to particular examples, some of which are illustrated in the appended drawings, such that the manner in which the features of the present disclosure may be understood in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

FIG. 1 discloses an example of an over current protection circuit in accordance with the present disclosure.

As mentioned above, in one of the implementations of the present disclosure, a timer capacitor 4 is used. The timer capacitor 4 is being charged, and discharged, using a first current source 1 and a second current source 2, respectively.

It is noted that the current sources 1, 2 may, alternatively, also be swapped. In this case, the inputs of the compare stage may need to be swapped as well. In the remainder it is assumed that the first current source 1 is proportional to the predefined set current and the second current source 2 is proportional to the load current.

It may be clear that the timer capacitor 4 is being charged whenever the load current is lower compared to the predefined set current. The timer capacitor 4 is discharged whenever the load current is higher compared to the predefined set current.

A first comparator 5 is provided. The first comparator 5 compares two inputs with one another. If the input provided at the non-inverting input of the first comparator 5 is higher compared to the input provided at the inverting input of the first comparator 5, then the comparator will output a logical high level.

The inverting input of the first comparator 5 is connected to the timer capacitor 4. This means that the voltage over the timer capacitor 4 is provided as an input to the inverting input of the first comparator 5.

The predefined reference value is connected to the non-inverting input of the first comparator 5. The predefined reference value is directly related to the value at which the over current protection circuit should act, i.e. it is related to the trip current.

As is clear from this particular implementation, there is a delay before the first comparator 5 will issue a logical high signal. The first comparator 5 will not immediately issue a logical high signal when the load current is higher that the predefined set current. First, the timer capacitor 4 needs to discharge to below the predefined reference value before the first comparator 5 issues the logical high level. This is one of the concepts of the present disclosure.

This particular implementation may further comprise an AND gate as indicated with reference numeral 7, a second comparator as indicated with reference numeral 6, a switch as indicated with reference numeral 8 and a third current source as indicated with reference numeral 3. These are explained here below.

The third current source 3 is used to expedite the discharging process. It is a predefined constant current that may be initially set to calibrate the over current protection circuit.

The third current source 3 may only be triggered, i.e. activated, whenever the load current is actually higher than the predefined set current. This is accomplished by using the switch 8 in combination with the second comparator 6. The second comparator 6 compared the load current with the predefined set current and output a logical high signal whenever the load current is higher compared to the predefined set current.

This logical high signal is used for controlling the switch 8. If the signal is high, then the switch 8 is activated, such that the third current source 3 is activated. If the signal is low, then the switch 8 is deactivated, such that the third current source is deactivated.

The over current protection circuit may thus comprise a second comparator 6, wherein an inverting input of said second comparator is arranged to receive said predefined set current, and wherein a non-inverting input of said second comparator is connected to said load current.

The output stage may comprise an AND port 7 for receiving an output of said first comparator and an output of said second comparator, wherein an output of said AND port 7 is said over current signal.

Figure 2:
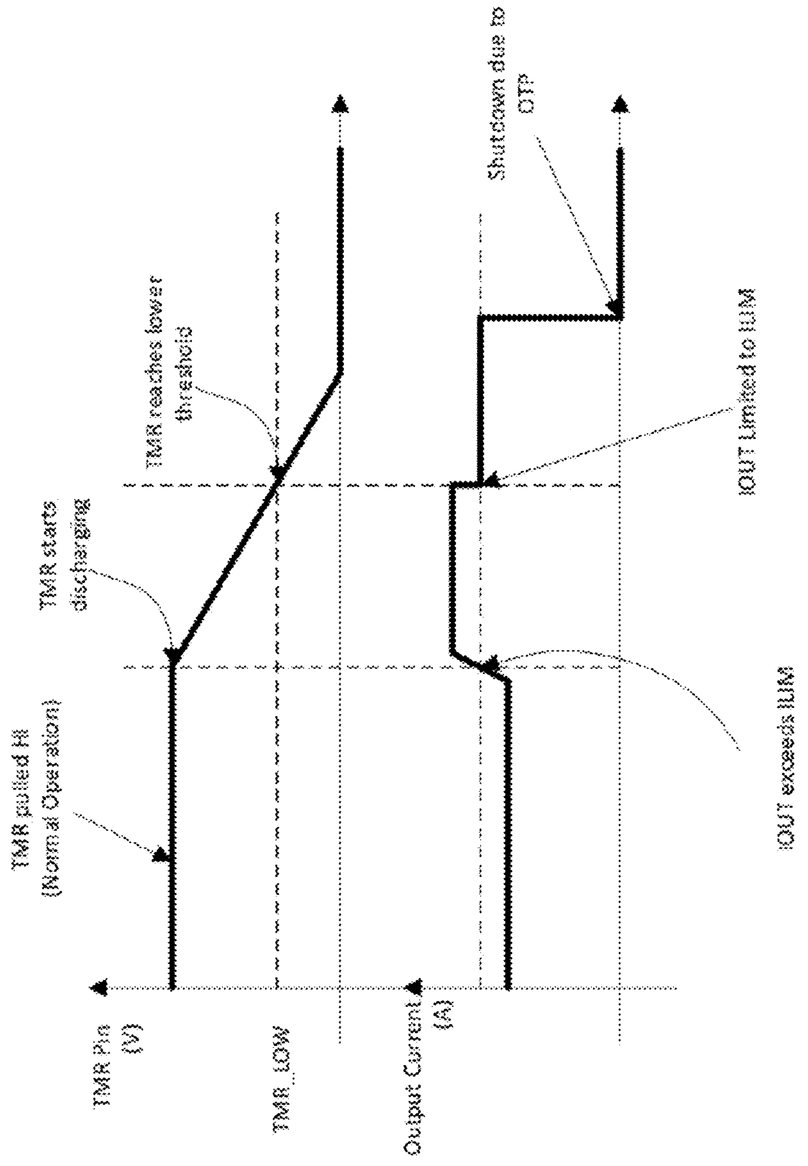
FIG. 2 discloses a typical waveform associated with the over current protection circuit in accordance with the present disclosure.

FIG. 2 discloses a typical waveform associated with the over current protection circuit in accordance with the present disclosure;

The first stage is related to the working operating in which the load current is lower compared to the predefined set current, i.e. the trip current. In this stage, the timer capacitor will be charged to its maximum value. This is indicated with the wording "TMR pulled HI (Normal Operation).

In a second stage, the load current will exceed the predefined set current. This would lead to the situation wherein the timer capacitor starts to discharge. This second phase is indicated with the wording "IOUT exceeds ILIM" and "TMR starts discharging".

In the third stage, the timer capacitor has charged to just below the predefined reference value, such that over current protection circuit will activate and issue a over current signal. This third stage is indicated with "TMR reaches lower threshold" and "IOUT Limited to ILIM".

It is noted that the over current signal may be used, by further circuitry, to limit the load current to the trip current. This is denoted in the third stage as well. Finally, a shutdown may be initiated if the load current does not further reduce to well below the trip current as indicated with the wording "Shutdown due to OTP".

Figure 3:
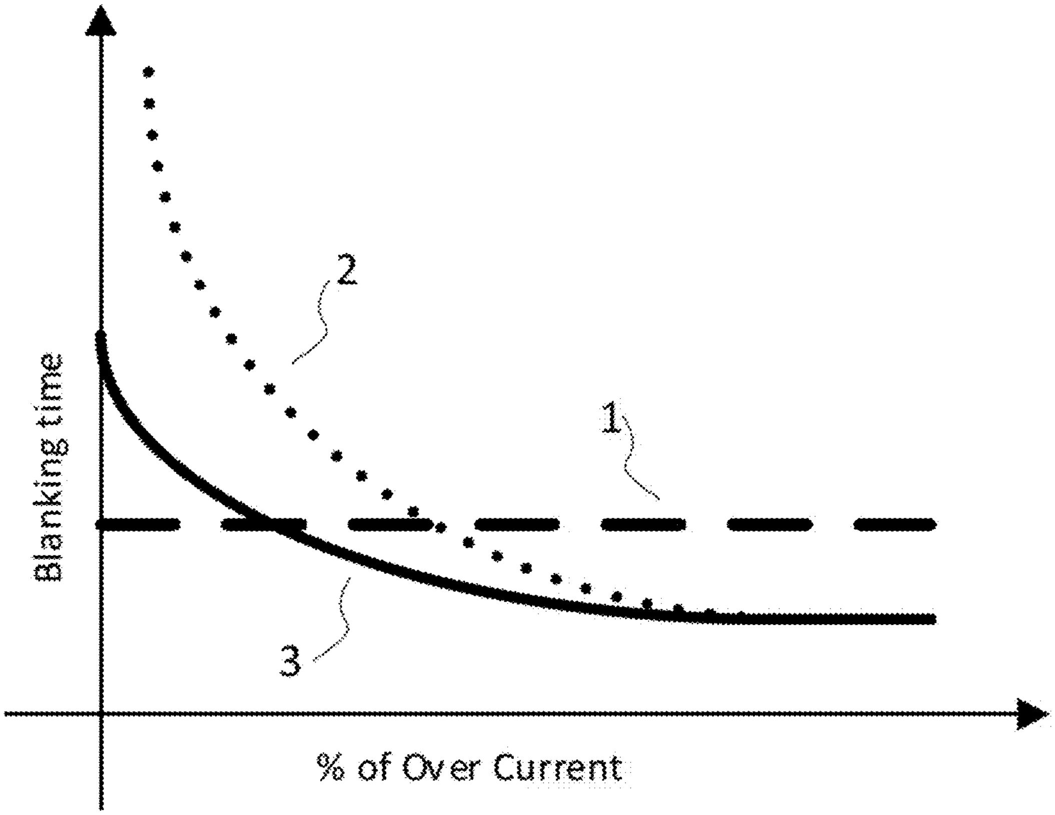
FIG. 3 discloses the blanking time value versus the over current percentage.

FIG. 3 discloses the blanking time value versus the over current percentage.

This particular graph related to the time that has passed until the over current protection activates. The first line, 1, is related to the prior art, wherein this particular time is constant, i.e. not related to the percentage of the over current condition. Whether the load current is way above the trip current, or close to the trip current, is not relevant for the prior art. The delay is always the same, for example about 100 ms.

Lines having reference numerals 2 and 3 are related to the present disclosure. Line 2 is related to the situation in which no third current source (see FIG. 1) is present. Line 3 is related to the situation in which a third current source (see FIG. 2) is present. As shown, the delay time, i.e. the time required before the over current protection circuit issues an over current signal, depends on the percentage of the over current condition. If hardly any over current situation occurs, then the so-called blanking time may be relatively large, for example 500 ms. However, for a very high over-current situation, the over current protection circuit may quickly issue the over current signal, i.e. well before the prior art solution.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

The invention claimed is:

1. An over current protection circuit arranged for providing an over current signal, the over current protection circuit comprising:
   a compare stage arranged for determining that a blanking time value is higher than a predefined reference value;
   an output stage arranged for outputting the over current signal based on the determination; and
   a blanking time stage arranged for generating the blanking time value, wherein the blanking time stage is arranged to start generating the blanking time value upon a load current exceeding a predefined set current,
   wherein the blanking time stage is further arranged to modulate the blanking time value based on a magnitude in which the load current exceeds the predefined set current.

2. The over current protection circuit in accordance with claim 1, wherein the blanking time stage is arranged to modulate the blanking time value so that the blanking time value is inversely proportional to the magnitude in which the load current exceeds the predefined set current.

3. The over current protection circuit in accordance with claim 1, wherein the blanking time stage is arranged to modulate the blanking time value so that the blanking time value is proportional to the square of the magnitude in which the load current exceeds the predefined set current.

4. The over current protection circuit in accordance with claim 1, wherein the blanking time stage comprises:
   a timer capacitor arranged for storing energy;
   a first current source arranged for charging the timer capacitor;
   a current provided by the first current source that is proportional to the predefined set current;
   a second current source arranged for discharging the timer capacitor;
   a current provided by the second current source that is proportional to the load current; and
   an output of the timer capacitor that is connected to the compare stage.

5. The over current protection circuit in accordance with claim 4, wherein the blanking time stage further comprises:
   a third current source for discharging the timer capacitor, wherein the third current source has a current provided that is constant.

6. The over current protection circuit in accordance with claim 5, wherein the compare stage further comprises:
   a second comparator having an inverting input that is arranged to receive the predefined set current and a non-inverting input that is connected to the load current,
   wherein the output stage comprises:
   an AND port arranged for receiving an output of the first comparator and an output of the second comparator, wherein the AND port has an output that is the over current signal.

7. The over current protection circuit in accordance with claim 6, wherein the blanking time stage further comprises:
   a switch connected in series with the third current source for activating, and deactivating, the third current source, and
   wherein the switch is controlled by the output of the second comparator.

8. The over current protection circuit in accordance with claim 4, wherein the compare stage comprises:
   a first comparator having an inverting input and a non-inverting input, wherein the inverting input of the first comparator is connected to the output of the timer capacitor, and the non-inverting input of the first comparator is connected to the predefined reference value.

9. A method for providing an over current signal using an over current protection circuit in accordance with claim 1, wherein the method comprises the steps of:
   determining, by the compare stage, that a blanking time value is higher than a predefined reference value;
   outputting, by the output stage, the over current signal based on the determination; and
   generating, by the blanking time stage, the blanking time value, wherein the blanking time value is started to be generated upon a load current exceeding a predefined set current,
   wherein the step of generating comprises modulating the blanking time value based on a magnitude in which the load current exceeds the predefined set current.

10. The method in accordance with claim 9, wherein the step of modulating further comprises:
   modulating the blanking time value so that the blanking time value is inversely proportional to the magnitude in which the load current exceeds the predefined set current.

11. The method in accordance with claim 10, wherein the blanking time stage comprises:
   a timer capacitor arranged for storing energy;
   a first current source arranged for charging the timer capacitor;
   a current provided by the first current source is proportional to the predefined set current;
   a second current source arranged for discharging the timer capacitor;
   a current provided by the second current source is proportional to the load current; and
   an output of the timer capacitor is connected to the compare stage.

12. A computer program product comprising a non-transitory computer readable medium having instructions stored thereon which, when executed by a controller, cause the controller to implement a method in accordance with claim 10.

13. The method in accordance with claim 9, wherein the step of modulating further comprises:
   modulating the blanking time value so that the blanking time value is proportional to the square of the magnitude in which the load current exceeds the predefined set current.

14. The method in accordance with claim 9, wherein the blanking time stage comprises:
   a timer capacitor arranged for storing energy;
   a first current source arranged for charging the timer capacitor;
   a current provided by the first current source is proportional to the predefined set current;
   a second current source arranged for discharging the timer capacitor;
   a current provided by the second current source is proportional to the load current; and
   an output of the timer capacitor is connected to the compare stage.

15. The method in accordance with claim 14, wherein the blanking time stage further comprises:

a third current source for discharging the timer capacitor, wherein the third current source provides a current that is constant.

16. The method in accordance with claim 14, wherein the compare stage comprises:

a first comparator having an inverting input that is connected to the output of the timer capacitor and a non-inverting input that is connected to the predefined reference value;

a second comparator having an inverting input that is arranged to receive the predefined set current and a non-inverting input that is connected to the load current;

a switch connected in series with the third current source for activating, and deactivating, the third current source, wherein the switch is controlled by the output of the second comparator;

wherein the output stage comprises:

an AND port arranged for receiving an output of the first comparator and an output of the second comparator, wherein the AND port has an output that is the over current signal.

17. The method in accordance with claim 15, wherein the compare stage comprises:

a first comparator having an inverting input that is connected to the output of the timer capacitor and a non-inverting input that is connected to the predefined reference value;

a second comparator having an inverting input that is arranged to receive the predefined set current and a non-inverting input that is connected to the load current;

a switch connected in series with the third current source for activating, and deactivating, the third current source, wherein the switch is controlled by the output of the second comparator;

wherein the output stage comprises:

an AND port arranged for receiving an output of the first comparator and an output of the second comparator, wherein the AND port has an output that is the over current signal.

18. A computer program product comprising a non-transitory computer readable medium having instructions stored thereon which, when executed by a controller, cause the controller to implement a method in accordance with claim 9.

* * * * *